US012765132B2

(12) United States Patent
Kim et al.

(10) Patent No.: US 12,765,132 B2
(45) Date of Patent: Oct. 13, 2026

(54) DISPLAY APPARATUS COMPRISING A QUANTUM DOT LAYER WITH RED, BLUE AND GREEN QUANTUM DOTS AND LIGHT EMITTING DIODES WITH A REFLECTIVE LAYER

(71) Applicant: SAMSUNG ELECTRONICS CO., LTD., Suwon-si (KR)

(72) Inventors: Sungyeol Kim, Suwon-si (KR); Kyehoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 715 days.

(21) Appl. No.: 18/082,216

(22) Filed: Dec. 15, 2022

(65) Prior Publication Data

US 2023/0307587 A1 Sep. 28, 2023

Related U.S. Application Data

(63) Continuation of application No. PCT/KR2022/018660, filed on Nov. 24, 2022.

(30) Foreign Application Priority Data

Mar. 10, 2022 (KR) ........................ 10-2022-0030314

(51) Int. Cl.
*H10H 20/851* (2025.01)
*G02F 1/13357* (2006.01)
(Continued)

(52) U.S. Cl.
CPC ... *H10H 20/8512* (2025.01); *G02F 1/133603* (2013.01); *G02F 1/133606* (2013.01);
(Continued)

(58) Field of Classification Search
CPC .......... H10H 20/8513; G02F 1/133603; G02F 1/133606
See application file for complete search history.

(56) References Cited

U.S. PATENT DOCUMENTS 8,084,934 B2 12/2011 Kim et al.
8,233,115 B2 7/2012 Hadlich et al.
(Continued)

FOREIGN PATENT DOCUMENTS

DE 202021105375 U1 12/2021
JP 2017-157278 A 9/2017
(Continued)

OTHER PUBLICATIONS

International Search Report (PCT/ISA/210) issued Mar. 14, 2023 by the International Searching Authority in international Patent Application No. PCT/KR2022/018660.
(Continued)

*Primary Examiner* — Aaron J Gray
(74) *Attorney, Agent, or Firm* — Sughrue Mion, PLLC

(57) ABSTRACT

A display apparatus includes a light source module including: a substrate, a plurality of light emitting diodes provided on the substrate and configured to emit blue light, a plurality of optical domes, each optical dome of the plurality of optical domes covering a corresponding light emitting diode of the plurality of light emitting diodes, and a plurality of reflective layers, each reflective layer of the plurality of reflective layers being provided in front of a corresponding light emitting diode of the plurality of light emitting diodes in a corresponding optical dome of the plurality of optical domes; a diffuser plate provided in front of the light source module and configured to uniformly diffuse irregular light emitted from the light source module; and a quantum dot sheet provided in front of the diffuser plate and configured to change a wavelength of light emitted from the light source
(Continued)

module, wherein the quantum dot sheet includes: a red quantum dot configured to convert the blue light emitted from the light source module into red light; a green quantum dot configured to convert the blue light emitted from the light source module into green light; and a blue quantum dot configured to convert the blue light emitted from the light source module into blue light having a wavelength that is longer than a wavelength the blue light emitted by the light source module.

11 Claims, 11 Drawing Sheets

(51) Int. Cl.

| | |
|---|---|
| ***H10H 20/01*** | (2025.01) |
| ***H10H 20/814*** | (2025.01) |
| ***H10H 20/854*** | (2025.01) |
| ***H10H 20/855*** | (2025.01) |

(52) U.S. Cl.

CPC ...... *H10H 20/0361* (2025.01); *H10H 20/814* (2025.01); *H10H 20/8513* (2025.01); *H10H 20/855* (2025.01); *H10H 20/854* (2025.01)

(56) References Cited

U.S. PATENT DOCUMENTS

| | | | | |
|---|---|---|---|---|
| 9,599,292 | B2 | 3/2017 | Jagt et al. | |
| 10,739,502 | B2 | 8/2020 | Baek et al. | |
| 11,237,428 | B2 | 2/2022 | Kim et al. | |
| 11,417,287 | B2 | 8/2022 | Kim et al. | |
| 2006/0244358 | A1* | 11/2006 | Kim | C09K 11/7739 313/486 |
| 2011/0128466 | A1* | 6/2011 | Ishii | H10H 20/8513 313/506 |
| 2012/0113672 | A1* | 5/2012 | Dubrow | G02B 6/0055 977/774 |
| 2019/0377229 | A1* | 12/2019 | Song | G02B 6/0053 |
| 2020/0278103 | A1* | 9/2020 | Tamura | F21V 13/08 |

FOREIGN PATENT DOCUMENTS

| | | | |
|---|---|---|---|
| KR | 10-2010-0011887 | A | 2/2010 |
| KR | 10-2014-0063852 | A | 5/2014 |
| KR | 1020140110368 | A | 9/2014 |
| KR | 10-2015-0074886 | A | 7/2015 |
| KR | 101604096 | B1 | 3/2016 |
| KR | 101643300 | B1 | 8/2016 |
| KR | 10-2018-0064616 | A | 6/2018 |
| KR | 10-2019-0112916 | A | 10/2019 |
| KR | 10-2113104 | B1 | 5/2020 |
| KR | 10-2021-0011180 | A | 2/2021 |

OTHER PUBLICATIONS

Written Opinion (PCT/ISA/237) issued Mar. 14, 2023 by the International Searching Authority in International Patent Application No. PCT/KR2022/018660.

Communication dated Aug. 3, 2025, issued by Korean Intellectual Property Office in Korean Application No. 10-2022-0030314.

* cited by examiner

DISPLAY APPARATUS COMPRISING A QUANTUM DOT LAYER WITH RED, BLUE AND GREEN QUANTUM DOTS AND LIGHT EMITTING DIODES WITH A REFLECTIVE LAYER

CROSS-REFERENCE TO RELATED APPLICATION(S)

This application is a continuation application, filed under 35 U.S.C. § 111(a), of International Application PCT/KR2022/018660 filed Nov. 24, 2022, which is based on and claims priority under 35 U.S.C. § 119 to Korean Patent Application No. 10-2022-0030314, filed on Mar. 10, 2022, in the Korean Intellectual Property Office, the disclosures of which are incorporated by reference herein in their entirety

BACKGROUND

1. Field

The disclosure relates to a display apparatus including a structure capable of improving a uniformity of blue light by using a blue quantum dot.

2. Description of Related Art

Generally, a display apparatus converts obtained or stored electrical information into visual information and displays the visual information to a user, and is used in various settings, such as the home or the workplace.

The display apparatus may be a monitor apparatus connected to a personal computer or a server computer, a portable computer device, a navigation terminal device, a general television apparatus, an Internet Protocol television (IPTV), a portable terminal device, such as a smart phone, a tablet PC, a personal digital assistant (PDA) or a cellular phone, various display apparatuses used to reproduce images, such as advertisements or movies in an industrial field, or various kinds of audio/video systems.

The display apparatus includes a light source module to convert electrical information into visual information, and the light source module includes a plurality of light sources configured to independently emit light.

Each of the plurality of light sources includes a light emitting diode (LED) or an organic light emitting diode (OLED). For example, the LED or the OLED may be mounted on a printed circuit board using surface-mount technology (SMT).

The plurality of light sources may emit blue light in response to the power supply. The blue light emitted from the plurality of light sources may be primarily diffused by a diffuser plate and secondarily diffused by a quantum dot sheet.

The quantum dot sheet may include a red quantum dot changing a wavelength of blue light so as to emit red light, and a green quantum dot changing a wavelength of blue light so as to emit green light. Because blue light passes through the quantum dot sheet and changes in wavelength, a portion of the blue light may be absorbed by the red quantum dot and the green quantum dot and then emitted as the red light and the green light, and a remaining portion of the blue light may be emitted as the blue light without change. That is, the light emitted as the red light and the green light may be secondarily diffused and emitted by the red quantum dot and the green quantum dot.

However, because the blue light passing through the quantum dot sheet without change is diffused only by the diffuser plate, a uniformity of the blue light may be reduced.

SUMMARY

Provided is a display apparatus including a structure capable of improving a uniformity of blue light by using a blue quantum dot.

Additional aspects of the disclosure will be set forth in part in the description which follows and, in part, will be apparent from the description, or may be learned by practice of the presented embodiments.

According to an aspect of the disclosure, a display apparatus includes: a light source module including: a substrate, a plurality of light emitting diodes provided on the substrate and configured to emit blue light, a plurality of optical domes, each optical dome of the plurality of optical domes covering a corresponding light emitting diode of the plurality of light emitting diodes, and a plurality of reflective layers, each reflective layer of the plurality of reflective layers being provided in front of a corresponding light emitting diode of the plurality of light emitting diodes in a corresponding optical dome of the plurality of optical domes; a diffuser plate provided in front of the light source module and configured to uniformly diffuse irregular light emitted from the light source module; and a quantum dot sheet provided in front of the diffuser plate and configured to change a wavelength of light emitted from the light source module, wherein the quantum dot sheet includes: a red quantum dot configured to convert the blue light emitted from the light source module into red light; a green quantum dot configured to convert the blue light emitted from the light source module into green light; and a blue quantum dot configured to convert the blue light emitted from the light source module into blue light having a wavelength that is longer than a wavelength the blue light emitted by the light source module.

The diffuser plate and the quantum dot sheet may be provided outside the plurality of optical domes.

The plurality of reflective layers may form a distributed Bragg reflector (DBR).

The quantum dot sheet may include a first sheet and a second sheet that are separated from each other.

The first sheet may be provided in front of the diffuser plate and may include the red quantum dot and the green quantum dot, and the second sheet may be provided in front of the first sheet and may include the blue quantum dot.

The first sheet may be provided in front of the diffuser plate and may include the blue quantum dot, and the second sheet may be provided in front of the first sheet and may include the red quantum dot and the green quantum dot.

The quantum dot sheet may be a single sheet and may include the red quantum dot, the green quantum dot, and the blue quantum dot.

The blue light emitted from the light source module may be primarily diffused by the diffuser plate and secondarily diffused by the quantum dot sheet to improve a light uniformity.

The red quantum dot may have a size larger than a size of the green quantum dot and a size of the blue quantum dot, and may be further configured to absorb the blue light emitted from the light source module and convert the absorbed blue light into red light having a wavelength longer a wavelength than the absorbed blue light.

The red quantum dot may be configured to diffuse the red light in all directions and emit the red light to an outside.

The green quantum dot may have a size that is less than a size of the red quantum dot and greater than a size of the blue quantum dot, and may be further configured to absorb the blue light emitted from the light source module and convert the absorbed blue light into green light having a wavelength longer than a wavelength the absorbed blue light.

The green quantum dot may be further configured to diffuse the green light in all directions and emit the green light to an outside.

The blue quantum dot may have a size smaller than a size of the red quantum dot and a size of the green quantum dot, and may be further configured to absorb a portion of the blue light emitted from the light source module and convert the absorbed portion of the blue light into the blue light having the wavelength longer than the wavelength of the blue light emitted from the light source module.

The blue quantum dot may be further configured to diffuse the blue light having the wavelength longer than the wavelength of the blue light emitted from the light source module in all directions and emit the blue light to an outside.

A portion of the blue light emitted from the light source module may pass through the quantum dot sheet without being absorbed by the red quantum dot, the green quantum dot, and the blue quantum dot, and is emitted to the outside.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
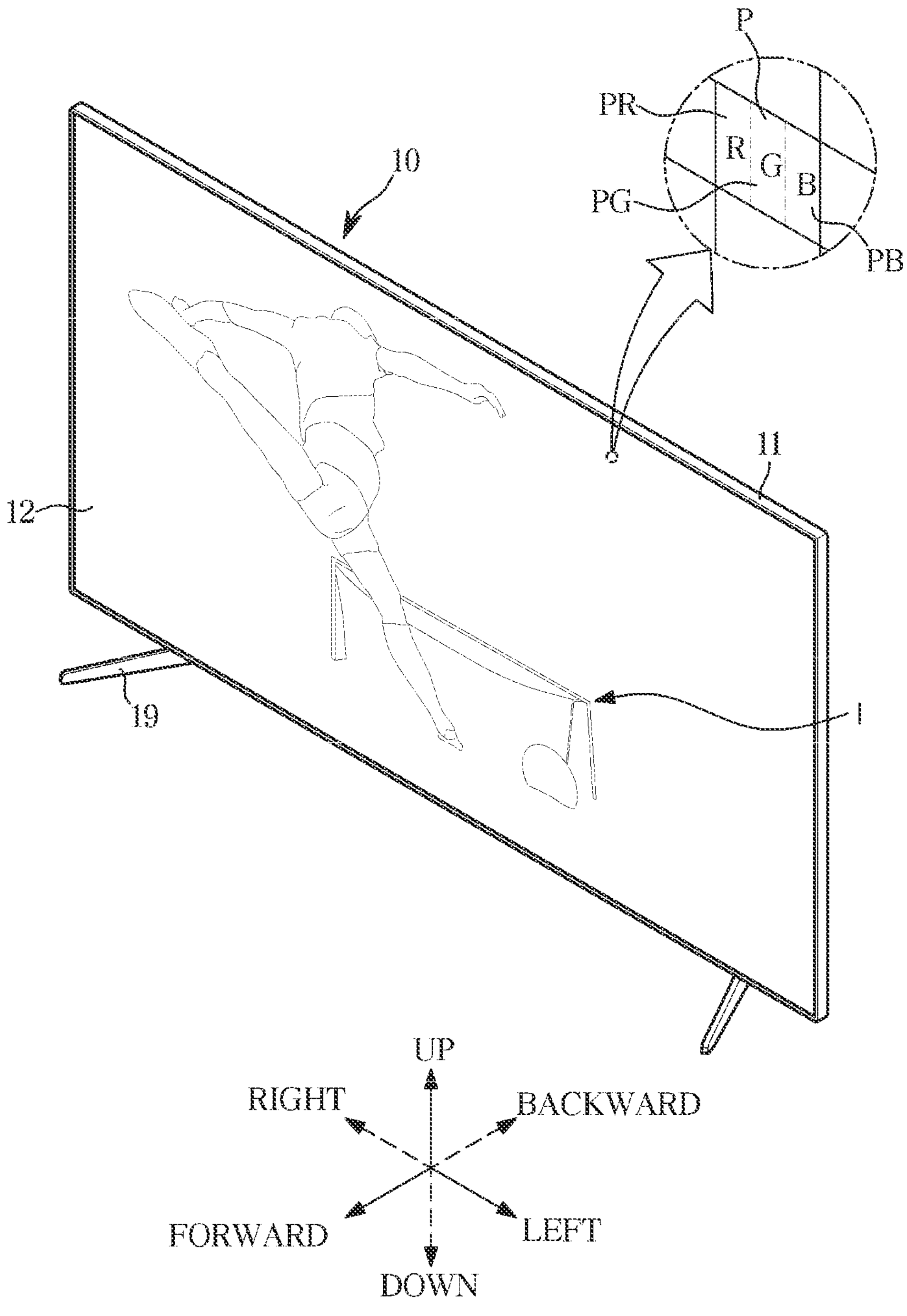
FIG. 1 is a view illustrating an appearance of a display apparatus according to an embodiment of the disclosure.

Embodiments described in the disclosure and configurations shown in the drawings are merely examples, and may be modified in various different ways.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

It will be understood that when an element is referred to as being "connected" to another element, it can be directly or indirectly connected to the other element, wherein the indirect connection includes "connection via a wireless communication network".

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Reference will now be made in detail to embodiments of the disclosure, examples of which are illustrated in the accompanying drawings.

FIG. 1 is a view illustrating an appearance of a display apparatus according to an embodiment of the disclosure.

A display apparatus 10 is a device that processes an image signal received from an external source and visually displays the processed image. Hereinafter a case in which the display apparatus 10 is a television is exemplified, but embodiments the disclosure are not limited thereto. For example, the display apparatus 10 may be implemented in various forms, such as a monitor, a portable multimedia device, and a portable communication device, and the display apparatus 10 is not limited in its shape and form so long as it visually displays an image.

The display apparatus 10 may be a large format display (LFD) installed outdoors, such as a roof of a building or a bus stop. The outdoors is not limited to the outside of a building, and thus the display apparatus 10 according to an embodiment may be installed in any place as long as the display apparatus is accessible by a large number of people, even indoors, such as subway stations, shopping malls, movie theaters, companies, and stores.

The display apparatus 10 may receive content data including video data and audio data from various content sources and output video and audio corresponding to the video data and the audio data. For example, the display apparatus 10 may receive content data through a broadcast reception antenna or cable, receive content data from a content playback device, or receive content data from a content providing server of a content provider.

As illustrated in FIG. 1, the display apparatus 10 includes a body 11, a screen 12 provided to display an image I, and a supporter 19 provided below the body 11 to support the body 11.

The body 11 may form an appearance of the display apparatus 10, and the body 11 may include a component configured to allow the display apparatus 10 to display the image I and to perform various functions. Although the body 11 shown in FIG. 1 is in the form of a flat plate, the shape of the body 11 is not limited thereto. For example, the body 11 may have a curved plate shape.

The screen 12 may be formed on a front surface of the body 11, and display the image I. For example, the screen 12 may display a still image or a moving image. Further, the screen 12 may display a two-dimensional plane image or a three-dimensional image using binocular parallax of the user.

A plurality of pixels P may be formed on the screen 12 and the image I displayed on the screen 12 may be formed by a combination of the light emitted from the plurality of pixels P. For example, the image I may be formed on the screen 12 by combining light emitted from the plurality of pixels P as a mosaic.

Each of the plurality of pixels P may emit different brightness and different color of light. In order to emit different brightness of light, each of the plurality of pixels P may include a self-luminous panel (for example, a light emitting diode panel) configured to directly emit light or a non-self-luminous panel (for example, a liquid crystal panel) configured to transmit or block light emitted by a light source apparatus.

In order to emit light in the various colors, the plurality of pixels P may include sub-pixels PR, PG, and PB, respectively.

The sub-pixels PR, PG, and PB may include a red sub pixel PR emitting red light, a green sub pixel PG emitting green light, and a blue sub pixel PB emitting blue light. For example, the red light may represent a light beam having a wavelength of approximately 620 nm (nm=nanometers, one billionth of a meter) to 750 nm, the green light may represent a light beam having a wavelength of approximately 495 nm to 570 nm, and the blue light may represent a light beam having a wavelength of approximately 450 nm to 495 nm.

By combining the red light of the red sub pixel PR, the green light of the green sub pixel PG and the blue light of the blue sub pixel PB, each of the plurality of pixels P may emit different brightness and different color of light.

Figure 2:
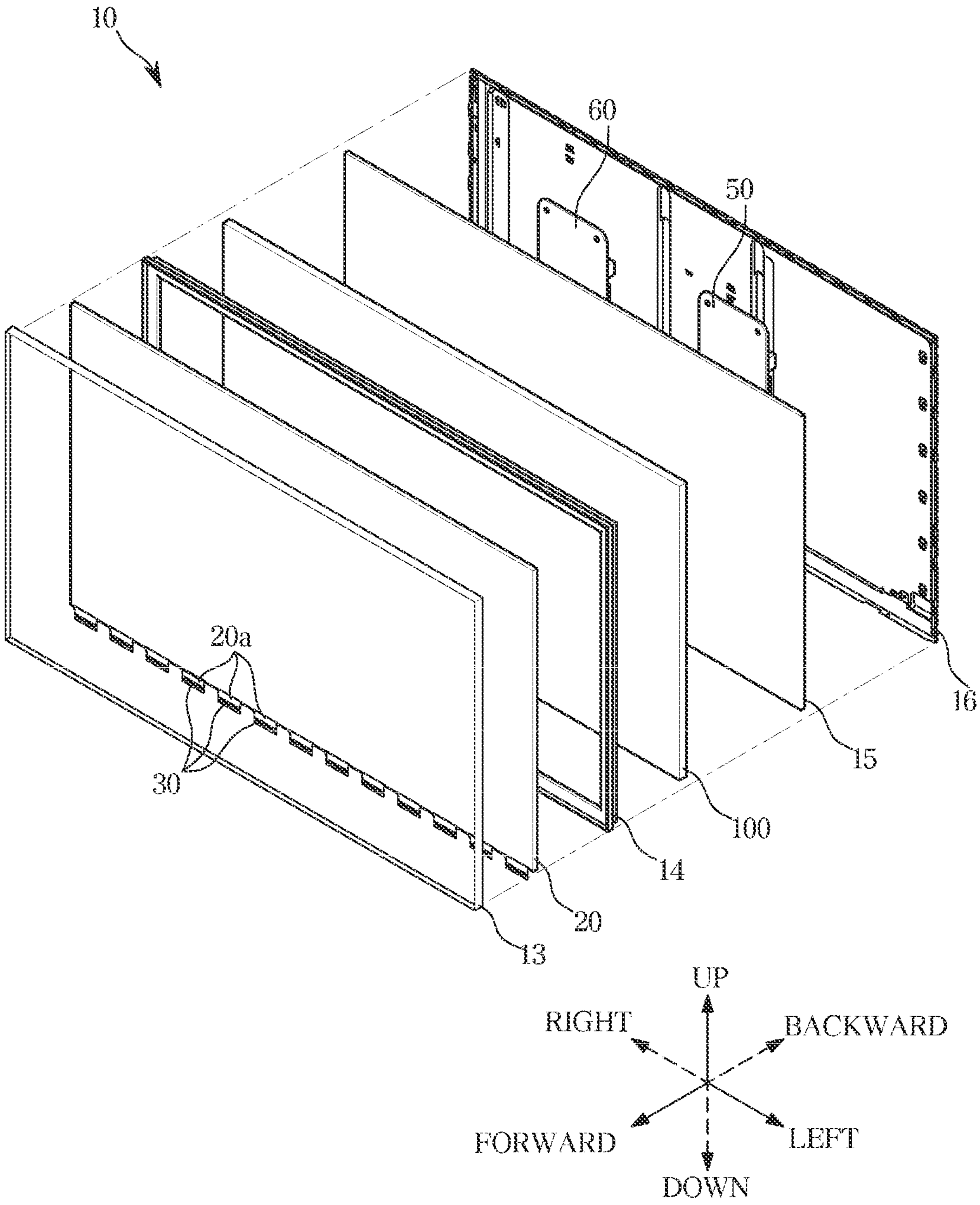
FIG. 2 is an exploded view illustrating the display apparatus shown in FIG. 1.

FIG. 2 is an exploded view illustrating the display apparatus shown in FIG. 1.

As shown in FIG. 2, various components configured to generate the image I on the screen S may be provided inside the body 11 (refer to FIG. 1).

For example, the body 11 (refer to FIG. 1) may include a light source apparatus 100 that is a surface light source, a display panel 20 configured to block or transmit light emitted from the light source apparatus 100, a control assembly 50 configured to control an operation of the light source apparatus 100 and the display panel 20, and a power assembly 60 configured to supply power to the light source apparatus 100 and the display panel 20. Further, the body 11 may include a bezel 13, a frame middle mold 14, a bottom chassis 15 and a rear cover 16 which are provided to support and fix the display panel 20, the light source apparatus 100, the control assembly 50 and the power assembly 60.

The light source apparatus 100 may include a point light source configured to emit monochromatic light or white light. The light source apparatus 100 may refract, reflect, and scatter light in order to convert light, which is emitted from the point light source, into uniform surface light. For example, the light source apparatus 100 may include a plurality of light sources configured to emit monochromatic light or white light, a diffuser plate configured to diffuse light incident from the plurality of light sources, a reflective sheet configured to reflect light emitted from the plurality of light sources and a rear surface of the diffuser plate, and an optical sheet configured to refract and scatter light emitted from a front surface of the diffuser plate.

As mentioned above, the light source apparatus 100 may refract, reflect, and scatter light emitted from the light source, thereby emitting uniform surface light toward the front side.

Figure 3:
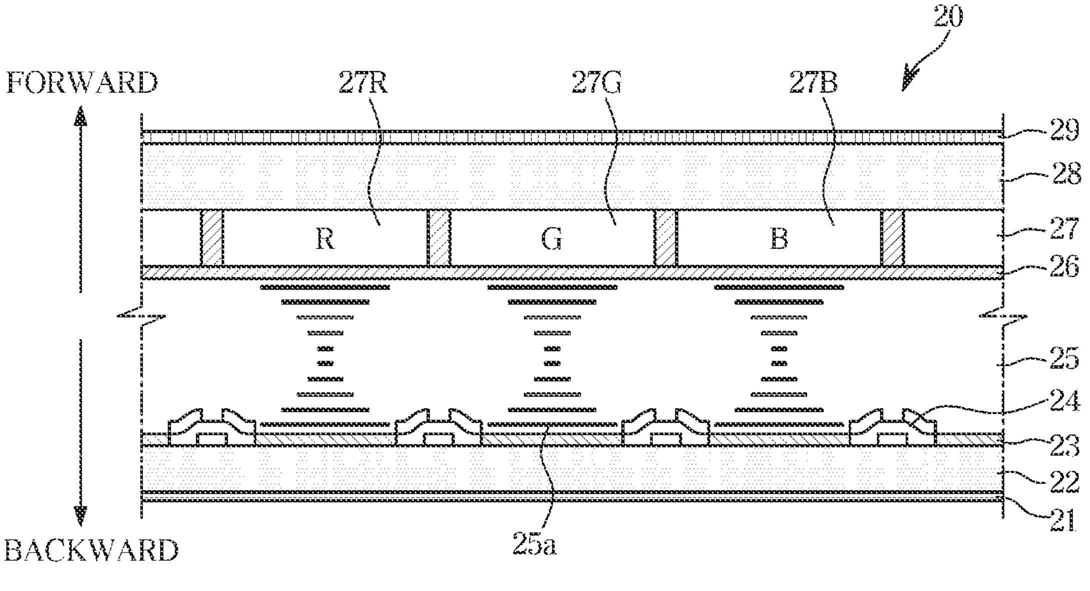
FIG. 3 is a side sectional view illustrating a display panel of the display apparatus shown in FIG. 2.

FIG. 3 is a side sectional view illustrating a display panel of the display apparatus shown in FIG. 2.

The display panel 20 may be provided in front of the light source apparatus 100 and block or transmit light emitted from the light source apparatus 100 to form the image I.

A front surface of the display panel 20 may form the screen 12 of the display apparatus 10 described above, and the display panel 20 may form the plurality of pixels P. In the display panel 20, the plurality of pixels P may independently block or transmit light from the light source apparatus 100, and the light transmitted through the plurality of pixels P may form the image I displayed on the screen 12.

For example, as shown in FIG. 3, the display panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 may be provided on the outside of the first and second transparent substrates 22 and 28.

Each of the first polarizing film 21 and the second polarizing film 29 may transmit a specific light beam and block other light beams. For example, the first polarizing film 21 may transmit a light beam having a magnetic field vibrating in a first direction and block other light beams. In addition, the second polarizing film 29 may transmit a light beam having a magnetic field vibrating in a second direction and block other light beams. In this case, the first direction and the second direction may be perpendicular to each other. Accordingly, a polarization direction of the light transmitted through the first polarizing film 21 and a vibration direction of the light transmitted through the second polarizing film 29 may be perpendicular to each other. As a result, in general, light may not pass through the first polarizing film 21 and the second polarizing film 29 at the same time.

The color filter 27 may be provided on an inner side of the second transparent substrate 28.

The color filter 27 may include a red filter 27R transmitting red light, a green filter 27G transmitting green light, and a blue filter 27B transmitting blue light. The red filter 27R, the green filter 27G, and the blue filter 27B may be disposed parallel to each other. A region, in which the color filter 27 is formed, may correspond to the pixel P described above. A region in which the red filter 27R is formed may correspond to the red sub-pixel PR, a region in which the green filter 27G is formed may correspond to the green sub-pixel PG, and a region in which the blue filter 27B is formed may correspond to the blue sub-pixel PB.

The pixel electrode 23 may be provided on an inner side of the first transparent substrate 22, and the common electrode 26 may be provided on an inner side of the second transparent substrate 28.

The pixel electrode 23 and the common electrode 26 may be formed of a metal material through which electricity is conducted, and the pixel electrode 23 and the common electrode 26 may generate an electric field to change the arrangement of liquid crystal molecules 25*a* forming the liquid crystal layer 25 to be described below.

The pixel electrode 23 and the common electrode 26 may be formed of a transparent material, and may transmit light incident from the outside. For example, the pixel electrode 23 and the common electrode 26 may include indium tin oxide (ITO), indium zinc oxide (IZO), silver nanowire (Ag nano wire), carbon nanotube (CNT), graphene, or poly(3,4-ethylenedioxythiophene) (PEDOT).

The thin film transistor (TFT) 24 may be provided in an inner side of the first transparent substrate 22.

The TFT 24 may transmit or block a current flowing through the pixel electrode 23. For example, an electric field may be formed or removed between the pixel electrode 23 and the common electrode 26 in response to turning on (closing) or turning off (opening) the TFT 24.

The TFT 24 may be formed of poly-silicon, and may be formed by semiconductor processes, such as lithography, deposition, and ion implantation.

The liquid crystal layer 25 may be formed between the pixel electrode 23 and the common electrode 26, and the liquid crystal layer 25 may be filled with the liquid crystal molecules 25*a*.

Liquid crystals represent an intermediate state between a solid (crystal) and a liquid. Most of the liquid crystal materials are organic compounds, and the molecular shape is in the shape of an elongated rod, and the orientation of molecules is in an irregular state in one direction, but in a regular state in other directions. As a result, the liquid crystal has both the fluidity of the liquid and the optical anisotropy of the crystal (solid).

In addition, liquid crystals also exhibit optical properties according to changes in an electric field. For example, in the liquid crystal, the orientation of molecules forming the liquid crystal may change according to a change in an electric field. In response to an electric field being generated in the liquid crystal layer 25, the liquid crystal molecules 25*a* of the liquid crystal layer 25 may be disposed along the direction of the electric field. In response to the electric field not being generated in the liquid crystal layer 25, the liquid crystal molecules 25*a* may be disposed irregularly or disposed along an alignment layer. As a result, the optical properties of the liquid crystal layer 25 may vary depending on the presence or absence of the electric field passing through the liquid crystal layer 25.

A cable 20*a* configured to transmit image data to the display panel 20, and a display driver integrated circuit (DDI) (hereinafter referred to as 'driver IC') 30 configured to process digital image data and output an analog image signal may be provided at one side of the display panel 20.

The cable 20*a* may electrically connect the control assembly 50 and the power assembly 60 to the driver IC 30, and may also electrically connect the driver IC 30 to the display panel 20. The cable 20*a* may include a flexible flat cable or a film cable that is bendable.

The driver IC 30 may receive image data and power from the control assembly 50 and the power assembly 60 through the cable 20*a*. The driver IC 30 may transmit the image data and driving current to the display panel 20 through the cable 20*a*.

In addition, the cable 20*a* and the driver IC 30 may be integrally implemented as a film cable, a chip on film (COF), or a tape carrier package (TCP). In other words, the driver IC 30 may be arranged on the cable 20*b*. However, embodiments of the disclosure are not limited thereto, and the driver IC 30 may be arranged on the display panel 20.

The control assembly 50 may include a control circuit configured to control an operation of the display panel 20 and the light source apparatus 100. The control circuit may process image data received from an external content source, transmit the image data to the display panel 20, and transmit dimming data to the light source apparatus 100.

The power assembly 60 may supply power to the display panel 20 and the light source apparatus 100 to allow the light source apparatus 100 to output surface light and to allow the display panel 20 to block or transmit the light of the light source apparatus 100.

The control assembly 50 and the power assembly 60 may be implemented as a printed circuit board and various circuits mounted on the printed circuit board. For example, the power circuit may include a capacitor, a coil, a resistance element, a processor, and a power circuit board on which the capacitor, the coil, the resistance element, and the processor are mounted. Further, the control circuit may include a memory, a processor, and a control circuit board on which the memory and the processor are mounted.

Figure 4:
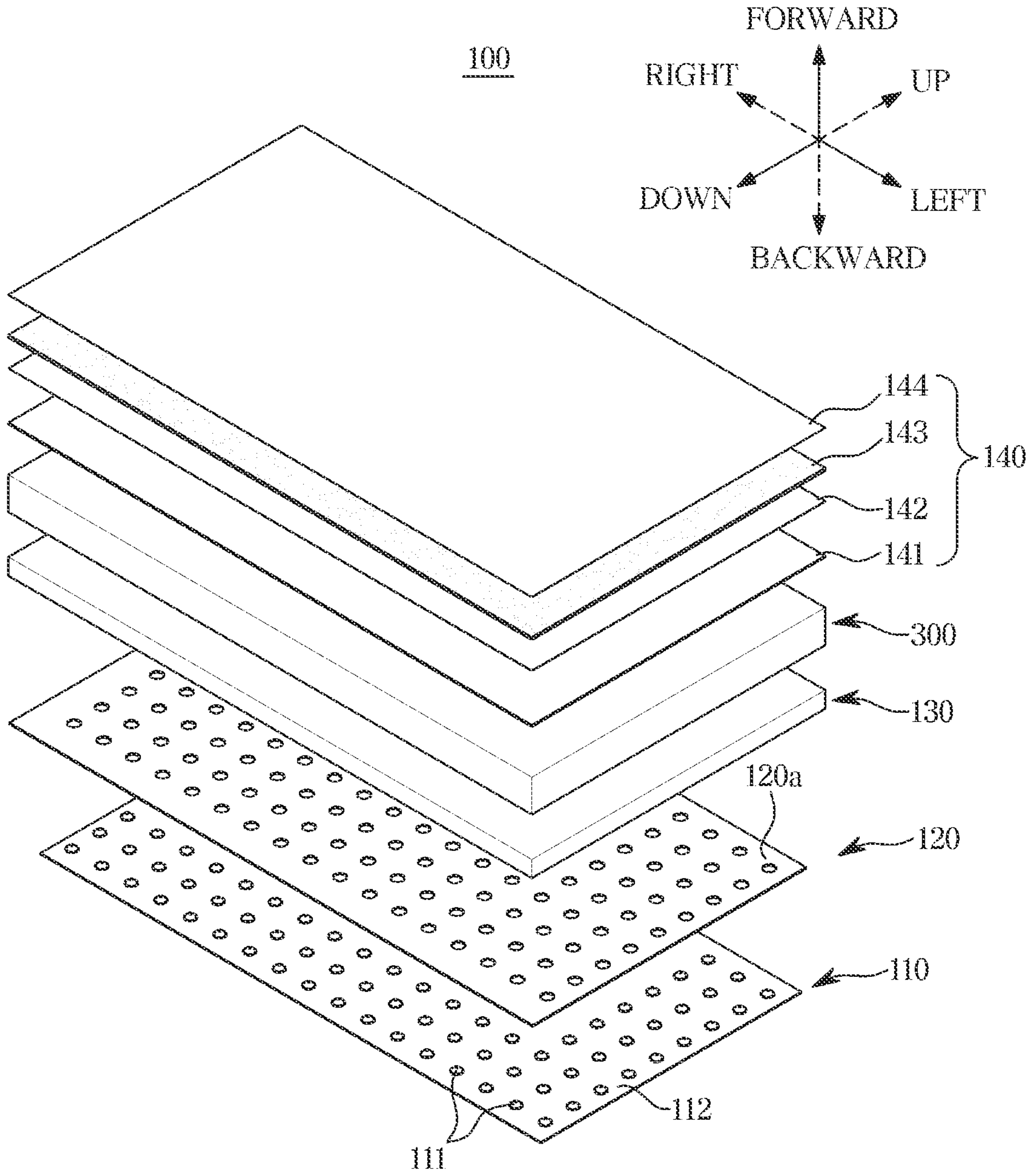
FIG. 4 is an exploded view illustrating a light source apparatus shown in FIG. 2.
Figure 5:
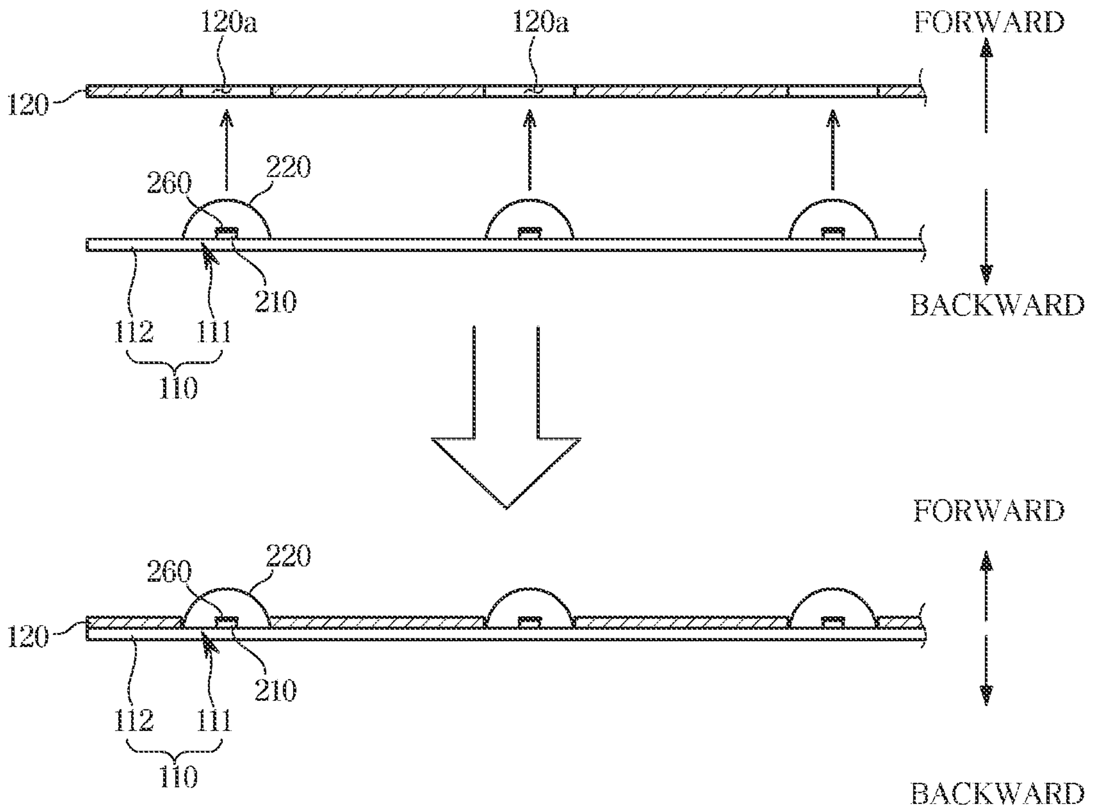
FIG. 5 is a view illustrating coupling between a light source module and a reflective sheet included in the light source apparatus shown in FIG. 4.

FIG. 4 is an exploded view illustrating a light source apparatus shown in FIG. 2. FIG. 5 is a view illustrating coupling between a light source module and a reflective sheet included in the light source apparatus shown in FIG. 4.

The light source apparatus 100 may include a light source module 110 configured to generate light, a reflective sheet 120 configured to reflect light, a diffuser plate 130 configured to uniformly diffuse light, a quantum dot sheet 300 configured to improve a color reproducibility by changing a wavelength of light, and an optical sheet 140 configured to improve a luminance of light that is emitted.

The light source module 110 may be arranged at a rear of the display panel 20. The light source module 110 may include a plurality of light sources 111 configured to emit light, and a substrate 112 provided to support/fix the plurality of light sources 111.

The plurality of light sources 111 may be disposed in a predetermined pattern to emit light with a uniform luminance. The plurality of light sources 111 may be disposed in such a way that a distance between one light source and light sources adjacent thereto is the same.

For example, as shown in FIG. 4, the plurality of light sources 111 may be disposed in rows and columns. Accordingly, the plurality of light sources may be disposed such that an approximate square is formed by four adjacent light sources. In addition, any one light source may be disposed adjacent to four light sources, and a distance between one light source and four adjacent light sources may be approximately the same.

Alternatively, the plurality of light sources may be disposed in a plurality of rows, and a light source belonging to each row may be disposed at the center of two light sources belonging to an adjacent row. Accordingly, the plurality of light sources may be disposed such that an approximately equilateral triangle is formed by three adjacent light sources. In this case, one light source may be disposed adjacent to six light sources, and a distance between one light source and six adjacent light sources may be approximately the same.

However, the pattern in which the plurality of light sources 111 is disposed is not limited to the patterns described above, and the plurality of light sources 111 may be disposed in various patterns to emit light with a uniform luminance.

The light source 111 may employ an element configured to emit monochromatic light (light of a specific wavelength, for example, blue light) or white light (for example, light of a mixture of red light, green light, and blue light) in various directions by receiving power. For example, the light source 111 may include a light emitting diode (LED).

The substrate 112 may fix the plurality of light sources 111 to prevent a change in the position of the light source 111. Further, the substrate 112 may supply power to the light source 111 to emit light.

The substrate 112 may fix the plurality of light sources 111 and may be configured with synthetic resin or tempered glass or a printed circuit board (PCB) on which a conductive power supply line for supplying power to the light source 111 is formed.

The reflective sheet 120 may reflect light emitted from the plurality of light sources 111 to the front side (forward side) or in a direction close to the front side.

In the reflective sheet 120, a plurality of through holes 120*a* are formed at positions corresponding to each of the plurality of light sources 111 of the light source module 110. In addition, the light source 111 of the light source module 110 may pass through the through hole 120*a* and protrude to the front of the reflective sheet 120.

For example, as shown in the upper portion of FIG. 5, in the process of assembling the reflective sheet 120 and the light source module 110, the plurality of light sources 111 of the light source module 110 is inserted into the through holes 120*a* formed on the reflective sheet 120. Accordingly, as shown in the lower portion of FIG. 5, the substrate 112 of the light source module 110 may be disposed behind the reflective sheet 120, but the plurality of light sources 111 of the light source module 110 may be disposed in front of the reflective sheet 120.

Accordingly, the plurality of light sources 111 may emit light in front of the reflective sheet 120.

The plurality of light sources 111 may emit light in various directions in front of the reflective sheet 120. The light may be emitted not only toward the diffuser plate 130 from the light source 111, but also toward the reflective sheet 120 from the light source 111. The reflective sheet 120 may reflect light, which is emitted toward the reflective sheet 120, toward the diffuser plate 130.

Light emitted from the light source 111 may pass through various objects, such as the diffuser plate 130, the quantum dot sheet 300 and the optical sheet 140. Among incident light beams passing through the diffuser plate 130, the quantum dot sheet 300 and the optical sheet 140, some of the incident light beams may be reflected from the surfaces of the diffuser plate 130, the quantum dot sheet 300 and the optical sheet 140. The reflective sheet 120 may reflect light reflected by the diffuser plate 130, the quantum dot sheet 300 and the optical sheet 140.

The diffuser plate 130 may be provided in front of the light source module 110 and the reflective sheet 120, and may evenly distribute the light emitted from the light source 111 of the light source module 110.

As described above, the plurality of light sources 111 may be disposed in various places on the rear surface of the light source apparatus 100. Although the plurality of light sources 111 is disposed at equal intervals on the rear surface of the light source apparatus 100, unevenness in luminance may occur depending on the positions of the plurality of light sources 111.

Within the diffuser plate 130, the diffuser plate 130 may diffuse light emitted from the plurality of light sources 111 to remove unevenness in luminance caused by the plurality of light sources 111. In other words, the diffuser plate 130 may uniformly emit uneven light of the plurality of light sources 111 to the front surface.

A detailed description of the quantum dot sheet 300 will be provided below.

The optical sheet 140 may include various sheets for improving luminance and luminance uniformity. For example, the optical sheet 140 may include a diffusion sheet 141, a first prism sheet 142, a second prism sheet 143, and a reflective polarizing sheet 144.

The diffusion sheet 141 may diffuse light for luminance uniformity. The light emitted from the light source 111 may be diffused by the diffuser plate 130 and may be diffused again by the diffusion sheet 141 included in the optical sheet 140.

The first and second prism sheets 142 and 143 may increase the luminance by condensing light diffused by the diffusion sheet 141. The first and second prism sheets 142 and 143 may include a prism pattern in the shape of a triangular prism, and the prism pattern, which is provided in plurality, may be disposed adjacent to each other to form a plurality of strips.

The reflective polarizing sheet 144 is a type of polarizing film and may transmit some of the incident light beams and reflect others for improving luminance. For example, the reflective polarizing sheet 144 may transmit polarized light in the same direction as a predetermined polarization direction of the reflective polarizing sheet 144, and may reflect polarized light in a direction different from the polarization direction of the reflective polarizing sheet 144. In addition, the light reflected by the reflective polarizing sheet 144 is recycled inside the light source apparatus 100, and thus the luminance of the display apparatus 10 may be improved by the light recycling.

The optical sheet 140 is not limited to the sheet or film shown in FIG. 4, and may include more various sheets, such as a protective sheet, or films.

Figure 6:
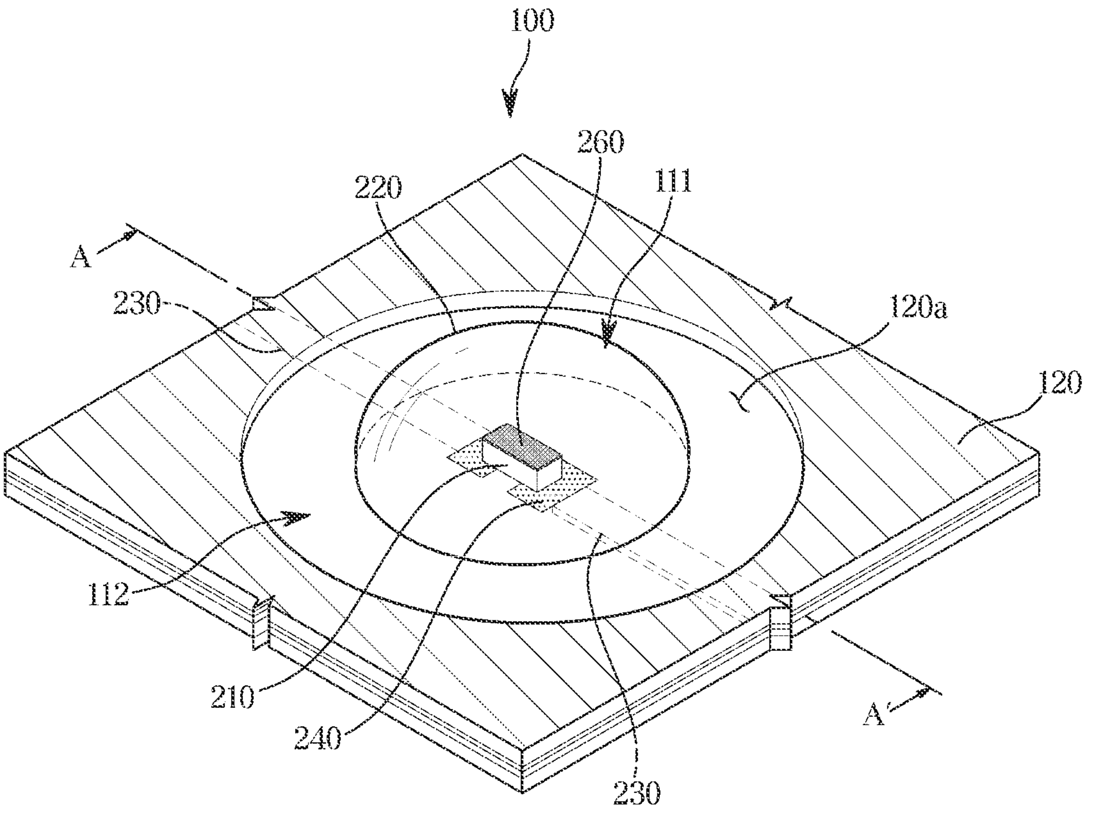
FIG. 6 is a perspective view illustrating a light source included in the light source apparatus shown in FIG. 4.
Figure 7:
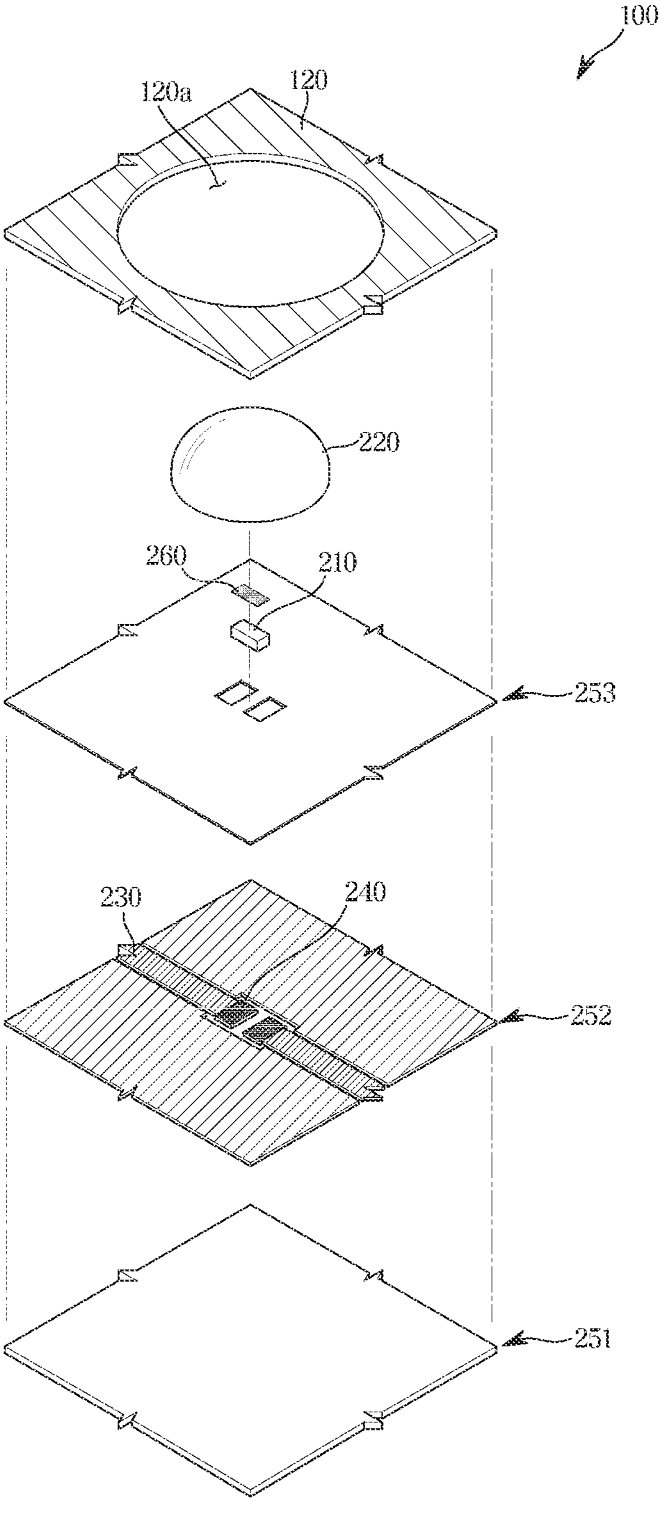
FIG. 7 is an exploded view illustrating the light source shown in FIG. 6.
Figure 8:
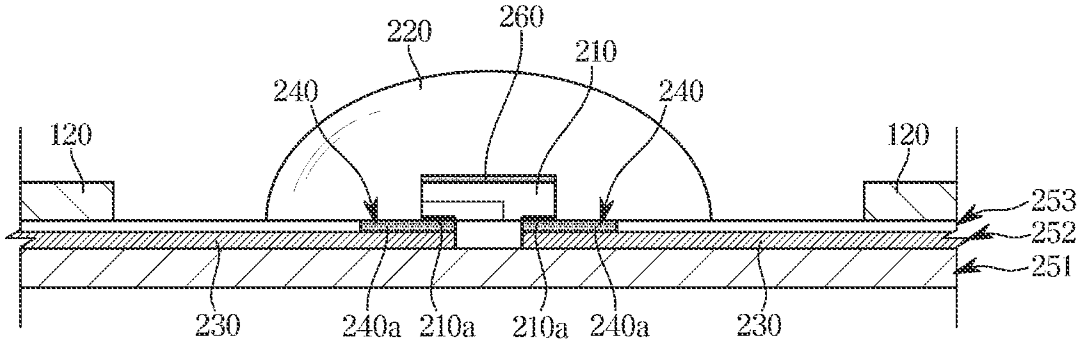
FIG. 8 is a cross-sectional view taken along line A-A' shown in FIG. 6.

FIG. 6 is a perspective view illustrating a light source included in the light source apparatus shown in FIG. 4. FIG. 7 is an exploded view illustrating the light source shown in FIG. 6. FIG. 8 is a cross-sectional view taken along line A-A' shown in FIG. 6.

The light source 111 of the light source apparatus 100 will be described with reference to FIGS. 6 to 8.

As described above, the light source module 110 may include the plurality of light sources 111. Each light source 111 of the plurality of light sources 111 may protrude forward of the reflective sheet 120 from the rear of the reflective sheet 120 by passing through a through hole 120*a*. Accordingly, as shown in FIGS. 6 and 7, the light source 111 and a part of the substrate 112 may be exposed toward the front of the reflective sheet 120 through the through hole 120*a*.

The light source 111 may include an electrical/mechanical structure disposed in a region defined by the through hole 120*a* of the reflective sheet 120.

Each of the plurality of light sources 111 may include a light emitting diode 210, an optical dome 220, and a reflective layer 260.

The light emitting diode 210 may include a P-type semiconductor and an N-type semiconductor for emitting light by recombination of holes and electrons. In addition, the light emitting diode 210 may be provided with a pair of electrodes 210*a* for supplying holes and electrons to the P-type semiconductor and the N-type semiconductor, respectively.

The light emitting diode 210 may convert electrical energy into optical energy. In other words, the light emitting diode 210 may emit light having a maximum intensity at a predetermined wavelength to which power is supplied. For example, the light emitting diode 210 may emit blue light having a peak value at a wavelength indicating blue color (for example, a wavelength between 430 nm and 495 nm).

The light emitting diode 210 may be directly attached to the substrate 112 in a Chip On Board (COB) method. In other words, the light source 111 may include the light emitting diode 210 to which a light emitting diode chip or a light emitting diode die is directly attached to the substrate 112 without an additional packaging.

In order to reduce the size of the light source 111, the light source module 110, in which the flip-chip type light emitting diode 210 is attached to the substrate 112 in a chip-on-board method, may be manufactured.

On the substrate 112, a power supply line 230 and a power supply pad 240 for supplying power to the flip-chip type light emitting diode 210 is provided.

On the substrate 112, the power supply line 230 for supplying electrical signals and/or power to the light emitting diode 210 from the control assembly 50 and/or the power assembly 60 may be provided.

As shown in FIG. 8, the substrate 112 may be formed by alternately laminating an insulation layer 251 that is non-conductive and a conduction layer 252 that is conductive.

A line or pattern, through which power and/or electrical signals pass, may be formed on the conduction layer 252. The conduction layer 252 may be formed of various materials having an electrical conductivity. For example, the conduction layer 252 may be formed of various metal materials, such as copper (Cu), tin (Sn), aluminum (Al), or an alloy thereof.

A dielectric of the insulation layer 251 may insulate between lines or patterns of the conduction layer 252. The insulation layer 251 may be formed of a dielectric for electrical insulation, such as FR-4.

The power supply line 230 may be implemented by a line or pattern formed on the conduction layer 252.

The power supply line 230 may be electrically connected to the light emitting diode 210 through the power supply pad 240.

The power supply pad 240 may be formed in such a way that the power supply line 230 is exposed to the outside.

A protection layer 253 configured to prevent or suppress damages caused by an external impact and/or damages caused by a chemical action (for example, corrosion, etc.) and/or damages caused by an optical action, to the substrate 112 may be formed at an outermost part of the substrate 112. The protection layer 253 may include a photo solder resist (PSR).

As shown in FIG. 8, the protection layer 253 may cover the power supply line 230 to prevent the power supply line 230 from being exposed to the outside.

For electrical contact between the power supply line 230 and the light emitting diode 210, a window may be formed in the protection layer 253 to expose a portion of the power supply line 230 to the outside. A portion of the power supply line 230 exposed to the outside through the window of the protection layer 253 may form the power supply pad 240.

A conductive adhesive material 240*a* for the electrical contact between the power supply line 230 exposed to the outside and the electrode 210*a* of the light emitting diode 210 may be applied to the power supply pad 240. The conductive adhesive material 240*a* may be applied within the window of the protection layer 253.

The electrode 210*a* of the light emitting diode 210 may be in contact with the conductive adhesive material 240*a*, and the light emitting diode 210 may be electrically connected to the power supply line 230 through the conductive adhesive material 240*a*.

The conductive adhesive material 240*a* may include a solder having an electrical conductivity. However, embodiments of the disclosure are not limited thereto, and the conductive adhesive material 240*a* may include electrically conductive epoxy adhesives.

Power may be supplied to the light emitting diode 210 through the power supply line 230 and the power supply pad 240, and in response to the supply of the power, the light emitting diode 210 may emit light. A pair of power supply pads 240 corresponding to each of the pair of electrodes 210*a* provided in the flip chip type light emitting diode 210 may be provided.

The optical dome 220 may cover the light emitting diode 210. The optical dome 220 may prevent or suppress damage to the light emitting diode 210 caused by an external mechanical action and/or damage to the light emitting diode 210 caused by a chemical action.

The optical dome 220 may have a dome shape formed in such a way that a sphere is cut into a surface not including the center thereof, or may have a hemispherical shape in such a way that a sphere is cut into a surface including the center thereof. A vertical cross section of the optical dome 220 may be a bow shape or a semicircle shape.

The optical dome 220 may be formed of silicone or epoxy resin. For example, the molten silicon or epoxy resin may be discharged onto the light emitting diode 210 through a nozzle, and the discharged silicon or epoxy resin may be cured, thereby forming the optical dome 220.

Accordingly, the shape of the optical dome 220 may vary depending on the viscosity of the liquid silicone or epoxy resin. For example, in a state in which the optical dome 220 is manufactured using silicon having a thixotropic index of about 2.7 to 3.3 (appropriately, 3.0), the optical dome 220 may include a dome ratio, indicating a ratio of a height of a dome to a diameter of a base of the dome (a height of the dome/a diameter of a base), of approximately 0.25 to 0.31 (appropriately 0.28). For example, the optical dome 220 formed of silicon having a thixotropic index of approximately 2.7 to 3.3 (appropriately, 3.0) may have a diameter of the base of approximately 2.5 mm and a height of approximately 0.7 mm.

The optical dome 220 may be optically transparent or translucent. Light emitted from the light emitting diode 210 may be emitted to the outside by passing through the optical dome 220.

In this case, the dome-shaped optical dome 220 may refract light like a lens. For example, light emitted from the light emitting diode 210 may be refracted by the optical dome 220 and thus may be dispersed.

As mentioned above, the optical dome 220 may disperse light emitted from the light emitting diode 210 as well as protecting the light emitting diode 210 from external mechanical and/or chemical or electrical actions.

The reflective layer 260 may be disposed in front of the light emitting diode 210. The reflective layer 260 may be disposed on the front surface of the light emitting diode 210. The reflective layer 260 may be a multilayer reflective structure in which a plurality of insulation layers having different refractive indices is alternately laminated. For example, the multilayer reflective structure may be a Distributed Bragg Reflector (DBR) in which a first insulation layer having a first refractive index and a second insulation layer having a second refractive index are alternately laminated.

Figure 9:
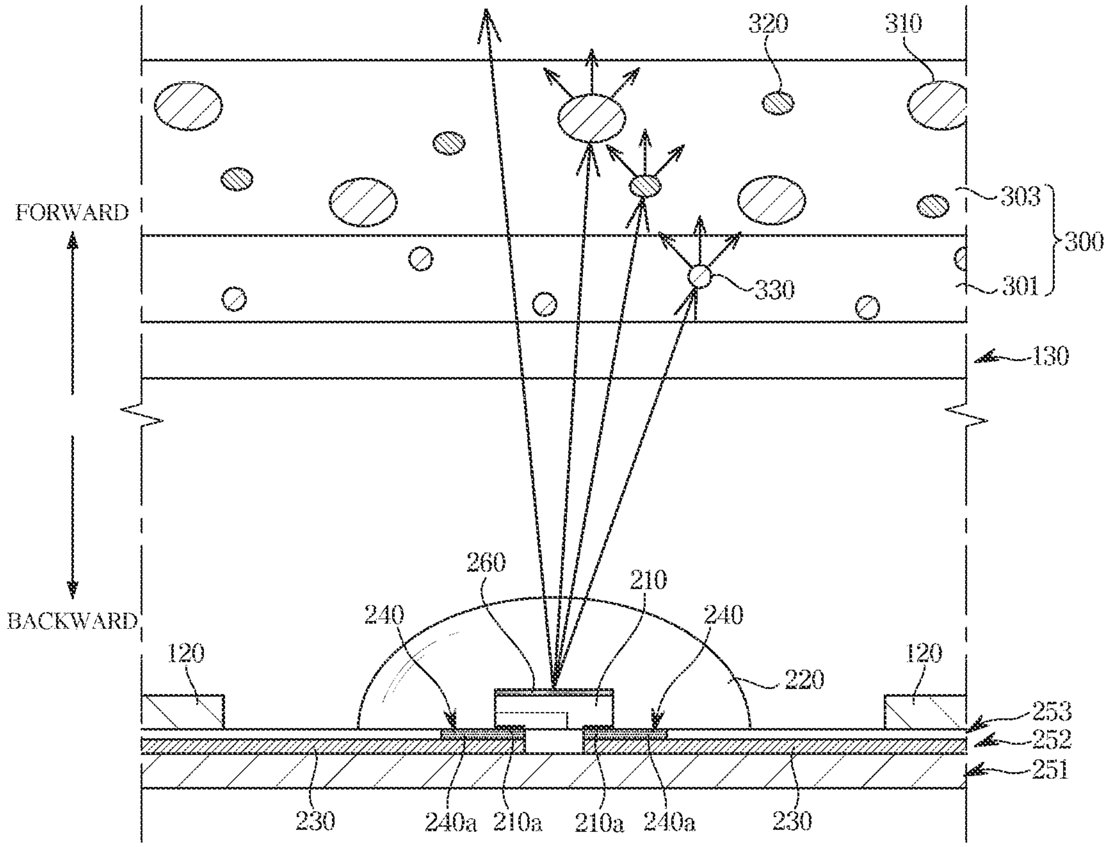
FIG. 9 is a view schematically illustrating a state in which a quantum dot sheet positioned in front of the light source module according to an embodiment is formed to be separated into two sheets, and a blue quantum dot is included in a second sheet.
Figure 10:
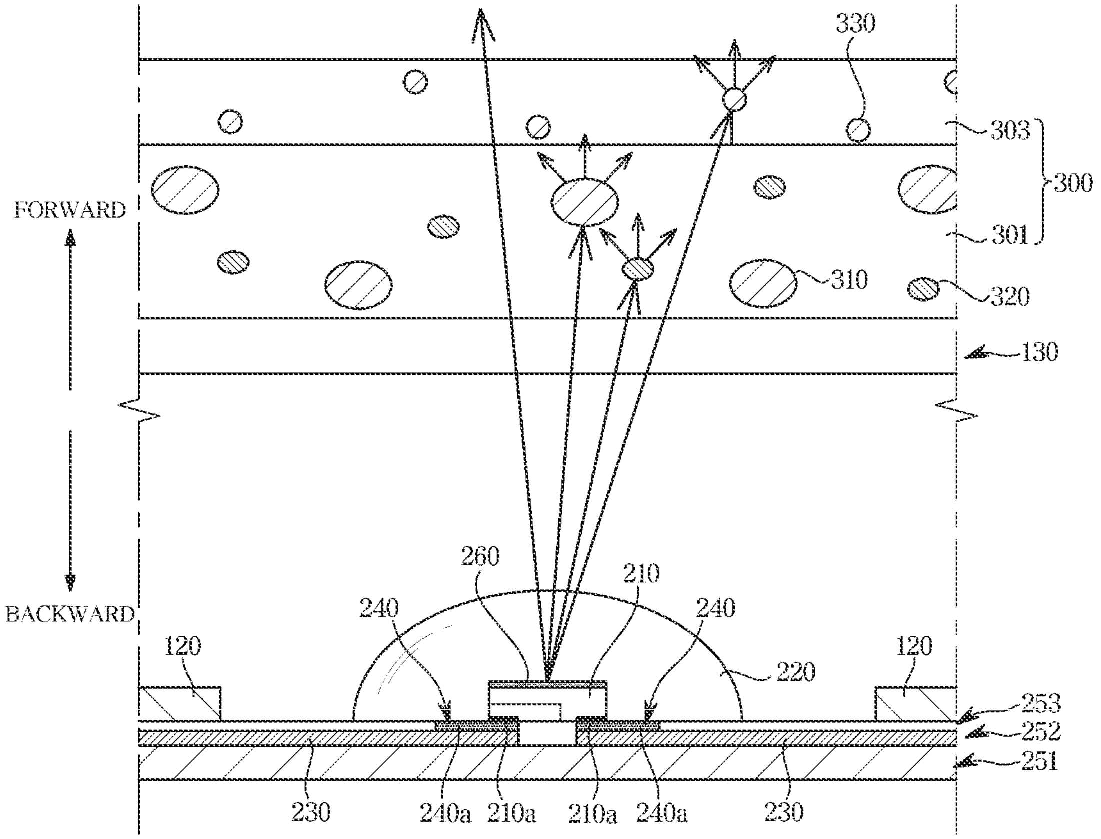
FIG. 10 is a view schematically illustrating a state in which the quantum dot sheet positioned in front of the light source module according to an embodiment is formed to be separated into two sheets, and the blue quantum dot is included in a first sheet.
Figure 11:
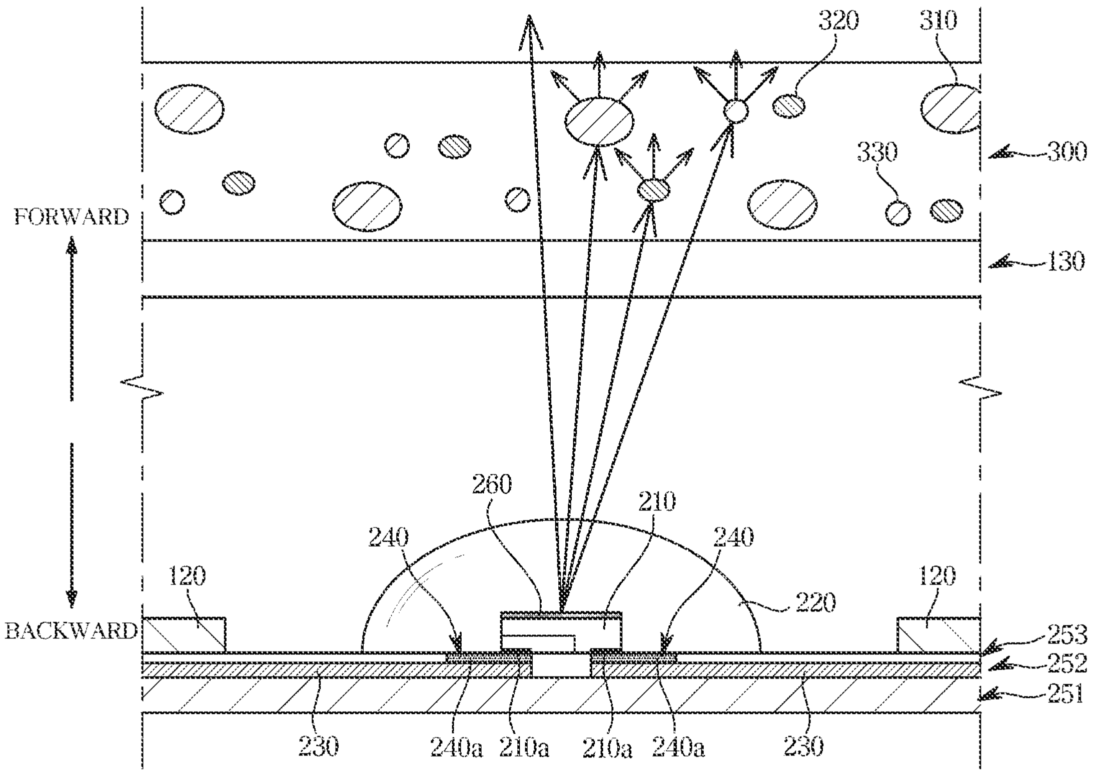
FIG. 11 is a view schematically illustrating a state in which the quantum dot sheet positioned in front of the light source module is formed as a single sheet including a red quantum dot, a green quantum dot, and the blue quantum dot.

FIG. 9 is a view schematically illustrating a state in which a quantum dot sheet positioned in front of the light source module according to an embodiment is formed to be separated into two sheets, and a blue quantum dot is included in a second sheet. FIG. 10 is a view schematically illustrating a state in which the quantum dot sheet positioned in front of the light source module according to an embodiment is formed to be separated into two sheets, and the blue quantum dot is included in a first sheet. FIG. 11 is a view schematically illustrating a state in which the quantum dot sheet positioned in front of the light source module is formed as a single sheet including a red quantum dot, a green quantum dot, and the blue quantum dot.

As shown in FIG. 9, the diffuser plate 130 and the quantum dot sheet 300 may be positioned in front of the light source module 110. That is, the diffuser plate 130 and the quantum dot sheet 300 may be positioned in front of the optical dome 220. Particularly, the diffuser plate 130 and the quantum dot sheet 300 may be positioned outside the optical dome 220 in front of the optical dome 220 (refer to FIG. 4).

The quantum dot sheet 300 may be positioned in front of the diffuser plate 130. The quantum dot sheet 300 may improve a color reproducibility by changing the wavelength of light emitted from the light emitting diode 210. Quantum dots, which are semiconductor crystals having a size of several nanometers that emit light, may be dispersedly disposed inside the quantum dot sheet 300. The quantum dot may receive blue light emitted from the light emitting diode 210 and generate all colors of visible light according to the size of quantum dot. The smaller the size of the quantum dot, the shorter the wavelength of light may be generated, and the larger the size of the quantum dot, the longer the wavelength of the light may be generated.

The blue light emitted from the light emitting diode 210 may be primarily diffused by the diffuser plate 130. The blue light primarily diffused by the diffuser plate 130 may be secondarily diffused by the quantum dot sheet 300. Because the blue light emitted from the light emitting diode 210 is diffused twice by the diffuser plate 130 and the quantum dot sheet 300, a uniformity of light passing through the quantum dot sheet 300 may be improved.

The quantum dot sheet 300 may include a red quantum dot 310 configured to convert blue light emitted from the light emitting diode 210 corresponding to the light source module 110 (refer to FIG. 4) into red light. The red quantum dot 310 may be formed to have a relatively largest size among the quantum dots 310, 320, and 330 disposed inside the quantum dot sheet 300. That is, the red quantum dot 310 may generate red light having a relatively longest wavelength among the quantum dots 310, 320, and 330 disposed inside the quantum dot sheet 300.

The blue light emitted from the light emitting diode 210 may be primarily diffused by the diffuser plate 130, and the blue light that is absorbed by the red quantum dot 310 and converted into red light may be secondarily diffused in all directions and emitted to the outside. That is, because the blue light emitted from the light emitting diode 210 is diffused twice by the diffuser plate 130 and the red quantum dot 310, a uniformity of the red light passing through the quantum dot sheet 300 may be improved.

The quantum dot sheet 300 may include a green quantum dot 320 configured to convert blue light emitted from the light emitting diode 210 into green light. The green quantum dot 320 may be formed to have a size smaller than the red quantum dot 310 and larger than the blue quantum dot 330 among the quantum dots 310, 320, and 330 disposed inside the quantum dot sheet 300. That is, the green quantum dot 320 may emit green light having a wavelength that is shorter than the red light generated by the red quantum dot 310 and longer than the blue light generated by the blue quantum dot 330 among the quantum dots 310, 320, and 330 disposed inside the quantum dot sheet 300.

The blue light emitted from the light emitting diode 210 may be primarily diffused by the diffuser plate 130, and the blue light that is absorbed by the green quantum dot 320 and converted into green light may be secondarily diffused in all directions and emitted to the outside. That is, because the blue light emitted from the light emitting diode 210 is diffused twice by the diffuser plate 130 and the green quantum dot 320, a uniformity of the green light passing through the quantum dot sheet 300 may be improved.

The quantum dot sheet 300 may include a blue quantum dot 330 configured to convert blue light emitted from the light emitting diode 210 into blue light having a longer wavelength. The blue quantum dot 330 may be formed to have a relatively smallest size among the quantum dots 310, 320, and 330 disposed inside the quantum dot sheet 300. That is, the blue quantum dot 330 may generate blue light having the relatively shortest wavelength among the quantum dots 310, 320, and 330 disposed inside the quantum dot sheet 300.

A portion of the blue light emitted from the light emitting diode 210 may be absorbed by the red quantum dot 310 and then emitted as red light. A portion of the blue light emitted from the light emitting diode 210 may be absorbed by the green quantum dot 320 and then emitted as green light. A portion of the blue light emitted from the light emitting diode 210 may be absorbed by the blue quantum dot 330 and then emitted as blue light having a longer wavelength. A portion of the blue light emitted from the light emitting diode 210 may be not absorbed by the red quantum dot 310, the green quantum dot 320, and the blue quantum dot 330, but may pass through the quantum dot sheet 300 without change and then emitted to the outside.

The blue quantum dot 330 may generate blue light having the relatively shortest wavelength among the quantum dots 310, 320, and 330 disposed inside the quantum dot sheet 300, but the blue light being absorbed by the blue quantum dot 330 and having a change in wavelength may have a wavelength longer than the blue light emitted from the light emitting diode 210. However, a portion of the blue light emitted from the light emitting diode 210 passes through the quantum dot sheet 300 as it is without being absorbed by the red quantum dot 310, the green quantum dot 320, and the blue quantum dot 330. Accordingly, the portion of the blue light may be emitted as blue light having the same wavelength as the blue light emitted from the light emitting diode 210. Therefore, the wavelength of the overall blue light emitted to the outside through the quantum dot sheet 300 may be greater than the wavelength of the blue light emitted from the light emitting diode 210 but less than the wavelength of the blue light that is absorbed by the blue quantum dot 330 and has a change in wavelength. For example, the wavelength of blue light emitted from the light emitting diode 210 may be approximately 430 nm to 449 nm, and the overall wavelength of blue light emitted to the outside through the quantum dot sheet 300 may be approximately 450 nm to 465 nm.

The blue light emitted from the light emitting diode 210 may be primarily diffused by the diffuser plate 130, and the light that is absorbed by the blue quantum dot 330 and converted into blue light may be secondarily diffused in all directions and emitted to the outside. That is, because a portion of the blue light emitted from the light emitting diode 210 is diffused twice by the diffuser plate 130 and the blue quantum dot 330, the uniformity of the blue light passing through the quantum dot sheet 300 may be improved.

The quantum dot sheet 300 may be formed in such a way that two sheets are separated from each other. The quantum dot sheet 300 may include a first sheet 301 positioned in front of the diffuser plate 130. The quantum dot sheet 300 may include a second sheet 303 positioned in front of the first sheet 301. That is, the first sheet 301 may be positioned closer to the diffuser plate 130 than the second sheet 303.

The first sheet 301 may include the red quantum dot 310 and the green quantum dot 320. The second sheet 303 may include the blue quantum dot 330.

As shown in FIG. 10, the blue quantum dot 330 may be included in the first sheet 301. In this case, the red quantum dot 310 and the green quantum dot 320 may be included in the second sheet 303.

As shown in FIG. 11, the quantum dot sheet 300 may be formed of a single sheet including all of the red quantum dot 310, the green quantum dot 320, and the blue quantum dot 330.

As is apparent from the above description, a display apparatus may improve a uniformity of blue light and have a slim design.

Although certain embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
- a light source module comprising:
  - a substrate;
  - a plurality of light emitting diodes provided on the substrate and configured to emit blue light having a wavelength greater than or equal to 430 nm and less than or equal to 449 nm;
  - a plurality of optical domes, each optical dome of the plurality of optical domes covering a corresponding light emitting diode of the plurality of light emitting diodes; and
  - a plurality of reflective layers, each reflective layer of the plurality of reflective layers being provided in front of a corresponding light emitting diode of the plurality of light emitting diodes in a corresponding optical dome of the plurality of optical domes;
- a diffuser plate provided in front of the light source module and configured to uniformly diffuse irregular light emitted from the light source module; and
- a quantum dot sheet provided in front of the diffuser plate and configured to change a wavelength of light emitted from the light source module,
- wherein the quantum dot sheet comprises:
  - a red quantum dot configured to convert at least a portion of the blue light emitted from the light source module into red light;
  - a green quantum dot configured to convert at least a portion of the blue light emitted from the light source module into green light; and
  - a blue quantum dot configured to convert at least a portion of the blue light emitted from the light source module into blue light having a wavelength greater than or equal to 450 nm and less than or equal to 465 nm,
- wherein the quantum dot sheet comprises a first sheet and a second sheet that are separated from each other,
- wherein the first sheet is provided in front of the diffuser plate and comprises the red quantum dot and the green quantum dot, and
- wherein the second sheet is provided in front of the first sheet and comprises the blue quantum dot.

2. The display apparatus of claim 1, wherein the diffuser plate and the quantum dot sheet are provided outside the plurality of optical domes.

3. The display apparatus of claim 1, wherein the plurality of reflective layers form a distributed Bragg reflector (DBR).

4. The display apparatus of claim 1, wherein the blue light emitted from the light source module is primarily diffused by the diffuser plate and secondarily diffused by the quantum dot sheet to improve a light uniformity.

5. The display apparatus of claim 4, wherein the red quantum dot has a size larger than a size of the green quantum dot and a size of the blue quantum dot, and is further configured to absorb the blue light emitted from the light source module and convert the absorbed blue light into red light having a wavelength longer a wavelength of the absorbed blue light.

6. The display apparatus of claim 5, wherein the red quantum dot is configured to diffuse the red light in all directions and emit the red light to an outside.

7. The display apparatus of claim 4, wherein the green quantum dot has a size that is less than a size of the red quantum dot and greater than a size of the blue quantum dot, and is further configured to absorb the blue light emitted from the light source module and convert the absorbed blue light into green light having a wavelength longer than a wavelength of the absorbed blue light.

8. The display apparatus of claim 7, wherein the green quantum dot is further configured to diffuse the green light in all directions and emit the green light to an outside.

9. The display apparatus of claim 4, wherein the blue quantum dot has a size smaller than a size of the red quantum dot and a size of the green quantum dot, and is further configured to absorb a portion of the blue light emitted from the light source module and convert the absorbed portion of the blue light into the blue light having the wavelength greater than or equal to 450 nm and less than or equal to 465 nm.

10. The display apparatus of claim 9, wherein the blue quantum dot is further configured to diffuse the blue light having the wavelength greater than or equal to 450 nm and less than or equal to 465 nm in all directions and to emit the blue light having the wavelength greater than or equal to 450 nm and less than or equal to 465 nm to an outside.

11. The display apparatus of claim 10, wherein a portion of the blue light emitted from the light source module passes through the quantum dot sheet without being absorbed by the red quantum dot, the green quantum dot, and the blue quantum dot, and is emitted to the outside.

* * * * *